United States Patent
Marion

(10) Patent No.: US 8,664,778 B2
(45) Date of Patent: Mar. 4, 2014

(54) METHOD OF FLIP-CHIP HYBRIDIZATION FOR THE FORMING OF TIGHT CAVITIES AND SYSTEMS OBTAINED BY SUCH A METHOD

(75) Inventor: Francois Marion, Saint-Martin le Vinoux (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 61 days.

(21) Appl. No.: 13/531,842

(22) Filed: Jun. 25, 2012

(65) Prior Publication Data
US 2013/0001807 A1  Jan. 3, 2013

(30) Foreign Application Priority Data

Jun. 30, 2011  (FR) ..................... 11 55913

(51) Int. Cl.
*H01L 23/28* (2006.01)
(52) U.S. Cl.
USPC ......................................... 257/787
(58) Field of Classification Search
CPC .......... H01L 2224/32225; H01L 2224/48227; H01L 2924/00; H01L 2224/73265; H01L 2924/00014
USPC ................. 257/678–733, 787–796, 257/E23.001–E23.194, E21.499–E21.519, 257/785, 737, 738, 100, 433, 434, 667, 257/E31.117–E31.118, E51.02, 127, 170, 257/409, 527, 594, 618–628, 257/E21.122–E21.128, E21.567–E21.57; 438/15, 25, 26, 51, 55, 64–67, 112, 438/124, 126, 127, 68, 113, 114, 458, 438/460–465; 264/261
See application file for complete search history.

(56) References Cited

U.S. PATENT DOCUMENTS

| | | | |
|---|---|---|---|
| 6,391,682 B1 | 5/2002 | Tsai et al. | |
| 6,594,916 B2* | 7/2003 | Boroson et al. | 34/335 |
| 8,293,572 B2* | 10/2012 | Chen et al. | 438/106 |
| 2005/0184404 A1* | 8/2005 | Huang et al. | 257/787 |

FOREIGN PATENT DOCUMENTS

| | | |
|---|---|---|
| DE | 198 10 060 A1 | 11/1998 |
| DE | 101 53 211 A1 | 1/2003 |
| DE | 10 2005 37 948 A1 | 2/2007 |
| WO | 99/52209 A1 | 10/1999 |
| WO | 2005/008779 A1 | 1/2005 |

OTHER PUBLICATIONS

French Search Report dated Feb. 9, 2012.

* cited by examiner

*Primary Examiner* — Dao H Nguyen
*Assistant Examiner* — Tram H Nguyen
(74) *Attorney, Agent, or Firm* — Burr & Brown, PLLC

(57) ABSTRACT

A method for manufacturing a microelectronic assembly including stacked first and second microelectronic components having a cavity therebetween including defining said cavity by means of a lateral wall forming a closed frame extending around a determined area of the first component except for an opening used as a vent; forming within the closed frame and opposite to the vent an obstacle capable of forming, in cooperation with the lateral wall, a bypass duct for the filling material; performing a flip-chip hybridization of the first and second components, a surface of the second component resting on the upper edge or end of the lateral wall formed on the first component to form said at least one cavity; injecting the filling material in liquid form between the two hybridized components to embed said at least one cavity and to make it tight by obstruction of the vent as said filling material solidifies.

14 Claims, 4 Drawing Sheets

METHOD OF FLIP-CHIP HYBRIDIZATION FOR THE FORMING OF TIGHT CAVITIES AND SYSTEMS OBTAINED BY SUCH A METHOD

FIELD OF THE INVENTION

The present disclosure relates to the connection of two components according to the flip-chip hybridization technique.

The present invention thus particularly applies to so-called "chip-on-chip", "chip-on-wafer", and "wafer-on-wafer" assemblies.

BACKGROUND OF THE INVENTION

Flip-chip hybridization is currently used to assemble two microelectronic components manufactured independently from each other, but operating complementarily, such as for example an array of unit detection elements and its read circuit, more generally by forming electromechanical connections with solder bumps or by insertion of hard metal inserts in ductile metal pads.

Such hybridization is often completed by the filling of the space between the two hybridized components with a protection material, usually an epoxy resin, this operation being called underfilling.

The filling material indeed enables to absorb thermal expansion differences between the first and second electronic components, which generally do not have the same thermal expansion coefficient, to protect the interconnections between the two components from an adverse environment such as, for example, a humid environment, and to provide a mechanical protection against shocks and vibrations.

Although the filling material has many advantages, it cannot be applied to any type of hybridized component. Indeed, one of the components or both components may also have on their surface electronic circuits that cannot operate if they are embedded in the filling material. This is for example generally true for electronic chips, and in particular for light detection circuits, such as bolometric detectors or circuits of MEMS (Micro Electro Mechanical Systems) type, or again certain electric connections.

Further, some circuits specifically require a low pressure or vacuum to be able to operate, such as for example bolometric detectors which require an environment with a very low heat conductivity. In such cases, the underfilling operation according to the state of the art is then impossible, since it implies embedding said circuits.

SUMMARY OF THE INVENTION

An object of the present invention is to provide a method for assembling two microelectronic components, which enables both to perform an underfilling operation and to create tight cavities embedded in the filling material used for the underfilling.

For this purpose, the present invention provides a method for manufacturing a microelectronic assembly comprising at least one first and one second microelectronic components placed one on top of the other and between which is formed at least one tight cavity, embedded in a filling material, the method comprising:
  defining said cavity by means of a lateral wall forming a closed frame extending around a determined area of the first component except for an opening used as a vent;
  forming within the closed frame and opposite to the vent an obstacle capable of forming, in cooperation with the lateral wall, a bypass duct or line for the filling material;
  performing a flip-chip hybridization of the first and second components, a surface of the second component resting on the upper edge or end of the lateral wall formed on the first component to form said at least one cavity;
  injecting the filling material in liquid form between the two hybridized components to embed said at least one cavity and to make it tight by obstruction of the vent as said filling material solidifies.

According to the present invention, the length of the bypass duct is greater than the distance traveled by the filling material between its presentation at the level of the vent and the moment when the filling material solidifies.

Term "lateral" here relates to the direction perpendicular to the surfaces placed against each other of the first and second components.

Term "liquid" here relates to a phase of a material where said material can flow to fill the space between the first and second components, the material being likely to have various viscosities according to the selected application.

In other words, a cavity is created by first forming an external "enclosure" only open at the level of a vent which communicates with the cavity by means of a bypass duct.

The bypass duct has two functions:
  its first function, in combination with the vent, is to let the cavity communicate with the outside during the flip-chip hybridization operation. In the absence of such a communication, that is, if the lateral wall defining the cavity is entirely closed, and thus deprived of any vent, and if the flip-chip hybridization is not performed in vacuum, the installing of the second component on the first component may cause an overpressure in the cavity, which would mechanically weaken the hybridized assembly and/or would adversely affect the operation of certain circuits such as bolometric detectors and MEMS-based circuits. Further, during certain flip-chip hybridizations, a deoxidation flow is used to guarantee the quality of the electric interconnects, which requires being able to carry off acid gas releases in the cavity once the interconnects have been formed, and thus having access to the cavities.
  the second function is to prevent the penetration of the filling material into the cavities. Indeed, a bypass duct lengthens the travel of the filling material between the vent and the inside of the cavity, which thus gives time for said material to solidify due to the flow time of the liquid material in the duct. It should besides be noted that the underfilling operation usually requires materials of low viscosity to obtain a satisfactory filling of the space separating the two hybridized components. In the absence of a bypass, the filling material in liquid form thus penetrates inside the cavity before it can be stopped by solidification.

It should also be noted that it is not necessary to tightly close the vent formed within the lateral wall, for example, by a drop of glue, before performing the underfilling, since the filling material itself tightly closes said vent due to its solidification.

Finally, it should be understood that the bypass duct may have multiple shapes and lengths which may be optimized, in particular, according to the flow speed of the liquid filling material, and thus according to its viscosity, to its solidification time, or to the time at which said solidification starts. It is also possible to define sufficiently long bypass ducts to make sure that the filling material does not penetrate into the cavity before being stopped by solidification.

It should also be understood that the hybridization of the components and the injection of filling material are not necessarily performed in this particular order and that, for example, the filling material may be deposited on the first component before the second component is installed, after which the second component would be installed.

According to a specific embodiment of the present invention, the forming of said at least one cavity results from the forming on the surface of said first component:
- of an external lateral wall forming a closed frame, except for a first vent;
- and of a lateral wall, internal with respect to the frame thus formed, defining a bypass duct between the first vent and said area.

In other words, according to this embodiment, the bypass duct is defined by two concentric frames, or at least by one frame enclosing another one.

According to another specific embodiment, the external and internal lateral walls associated with each of at least part or all of the cavities form an assembly of at least two frames nested around the cavity and closed, except for one vent per frame, the vent of a frame being arranged opposite to the vent of the closest frame containing it. This arrangement enables to decrease the surface area taken up by the bypass, while having lateral walls defining a substantially symmetrical assembly on the cavity circumference, thus implying that the stress exerted thereon is symmetrical and exerted uniformly during a thermal cycle.

According to another embodiment, the external and internal lateral walls associated with each of at least part or all of the cavities form a spiral-shaped duct opened towards the cavity by a second vent. For a same propagation surface area, this embodiment enables to multiply by two the propagation time, for example, as compared with the previous embodiment.

According to an embodiment of the present invention, the filling material in liquid form is a polymer cross-linkable, for example, by heating or irradiation, the solidification being performed by cross-linking of said polymer. In particular, for a polymer cross-linkable by irradiation, for example, with UVs, the solidification is thus very fast and enables to controllably stop the progress of the filling material by increasing the fluence of the UV radiation. Similarly, for a polymer cross-linkable by heating, it is possible to controllably stop the progress if a temperature greater than the minimum polymer cross-linking temperature is applied, for example, a temperature greater than 100° C. for 15 minutes for an epoxy resin.

According to an embodiment of the present invention, the first vents are formed substantially at the same location in the external frames of the cavities, and the filling material is injected at a location opposite to the first vents of the cavities. There thus is a delay between the time of injection of the liquid filling material between the hybridized components and the time of presentation of this material in front of the vents of the enclosures or external frames of the cavities. This delay may then be used to perform specific operations, such as for example, the creation of vacuum conditions, or a change of work platform.

According to an embodiment of the present invention, the length of the bypass ducts is determined according to the flow speed of the filling material in liquid form. This especially enables to minimize the length of the bypass duct, and thus to decrease the surface area granted to each cavity and decrease the quantity of material dedicated to the forming of the lateral walls.

According to an embodiment of the present invention, at least the injection of filling material is performed under a low pressure, and for example under vacuum, which provides cavities under low pressure or in vacuum. As a variation, the injection is performed under a controlled atmosphere, especially formed of a gas suitable for the operation of certain circuits, such as a rare gas or a neutral gas, for example.

The present invention also aims at a microelectronic assembly comprising first and second microelectronic components installed one on top of the other, and between which are formed tight cavities embedded in a filling material, said assembly being obtained according to a method of the above-mentioned type.

According to an embodiment, the tight cavities comprise microelectronic, optoelectronic, or optical circuits, and especially sensitive detection elements, electronic chips, MEMS-type circuits, or electric connectors.

According to an embodiment, the first microelectronic component or the second microelectronic component is a cap.

The foregoing and other features and advantages of the present invention will be discussed in detail in the following non-limiting description of specific embodiments in connection with the accompanying drawings, where the same reference numerals designate the same or similar elements.

DETAILED DESCRIPTION OF THE INVENTION

Figure 1:
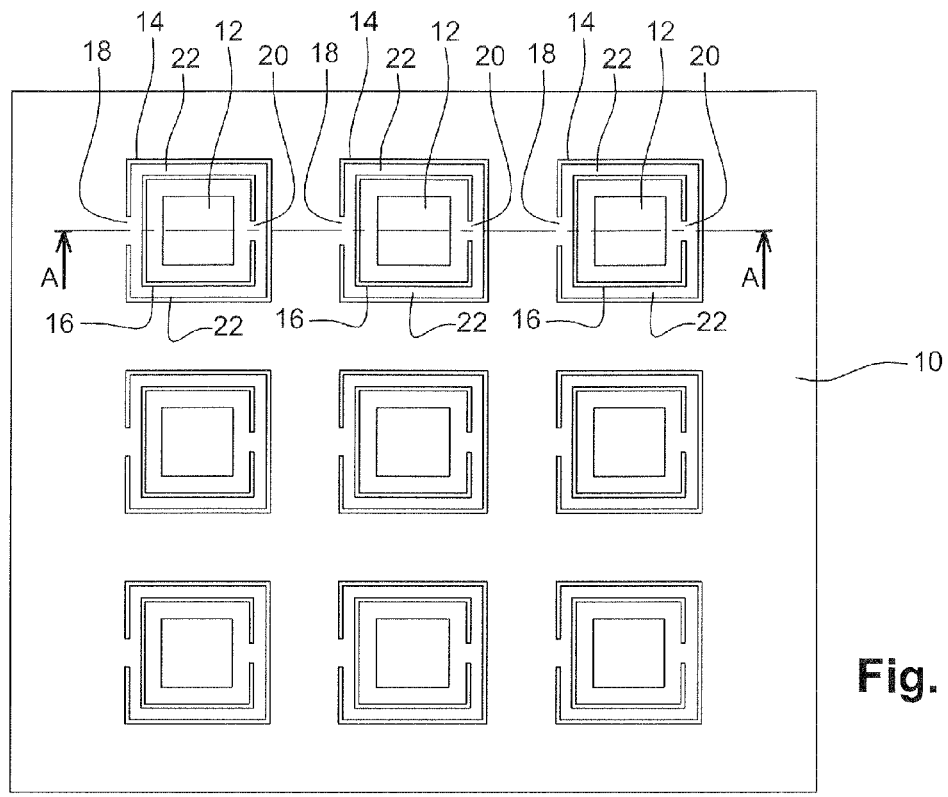
FIGS. 1 and 2 respectively are a top view and a cross-section view along axis A-A of a step of manufacturing of lateral walls on a substrate comprising circuits intended to be contained in tight cavities according to the present invention.

Referring to FIGS. 1 to 6, a method of an embodiment of the present invention applied to the collective forming of MEMS circuits, for example, an array of three by three MEMS circuits in the drawings, will now be described.

A circuit based on MEMSs for example comprises a substrate 10 on which or above which are formed MEMSs 12. For their operation, MEMSs 12 require being placed under low pressure, in vacuum, or under a controlled atmosphere. To achieve this, the MEMS circuits are enclosed in a tight cavity. MEMS circuits are well known per se and will not be described any further hereinafter. It should only be reminded that it is needed to provide tight cavities coated with a filling material in an underfilling operation.

Figure 2:
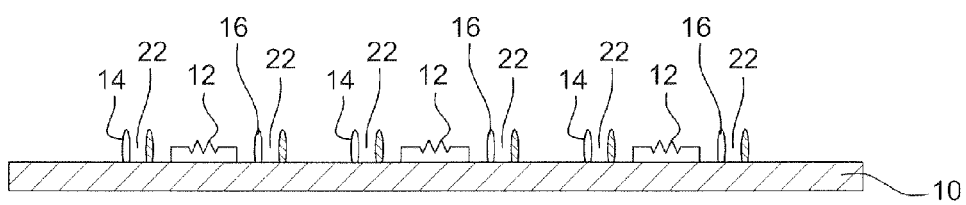

As shown in FIGS. 1 and 2, the method starts with the forming of lateral walls 14, 16 around each MEMS circuit 12 to form:
- an external frame 14 closed except for a first vent 18; and
- a frame 16, internal to external frame 14, closed except for a second vent 20, first vent 18 and second vent 20 being placed on either side of MEMS circuit 12.

External frame 14 and internal frame 16 thus define together a bypass duct 22 which conducts any liquid on presentation thereof at the level of first vent 18 to penetrate, through second vent 20, into the central area where MEMS circuit 12 is arranged, thereby lengthening the flow distance, and thus the time taken by the liquid to penetrate into this central area.

Figure 3:
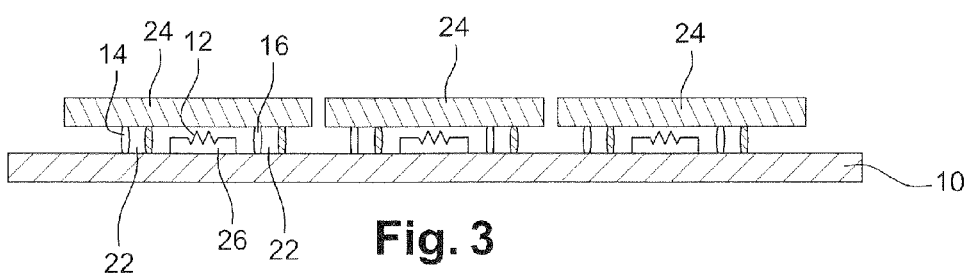
FIG. 3 is a cross-section view along axis A-A of the installation of a cap on the assembly described in FIGS. 1 and 2.

The method continues by the hybridization of an individual cap 24 for each MEMS circuit 12, so that cap 24 rests on the upper edge of lateral walls 14, 16 and that cap 24 is sealed on said walls. Cavities 26 are thus formed for MEMS circuits 12, which are, at this step of the method, tight except as concerns first vents 18 (FIG. 3).

Frames 14, 16 are for example formed by depositing beads of solder material such as used in electromechanical interconnects by solder bumps, for example, made of indium. The hybridization of caps 24 thus for example implements a thermocompression or a remelting to positively connect the cap to lateral walls 14, 16 and thus tightly seal the cavities containing MEMS circuits 12.

As a variation, caps 24 are for example provided with solid or hollow metal inserts inserting into the beads made of a ductile material and deposited on substrate 10, to seal caps 24. According to the application, caps 24 may also form electric interconnects with MEMS circuits 12 as known per se.

Figure 4:
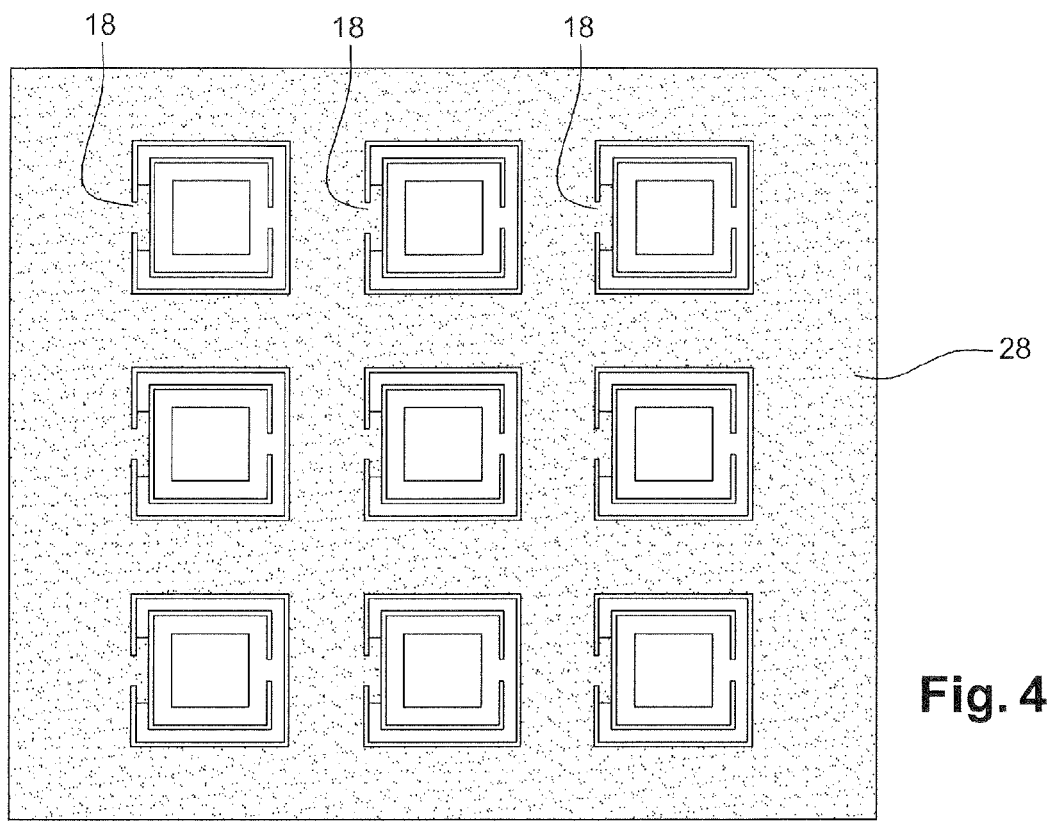
FIGS. 4 and 5 are respective top and cross-section views of the hybridized assembly once an underfilling operation has been performed, the cap being here shown in transparency in FIG. 4.
Figure 5:
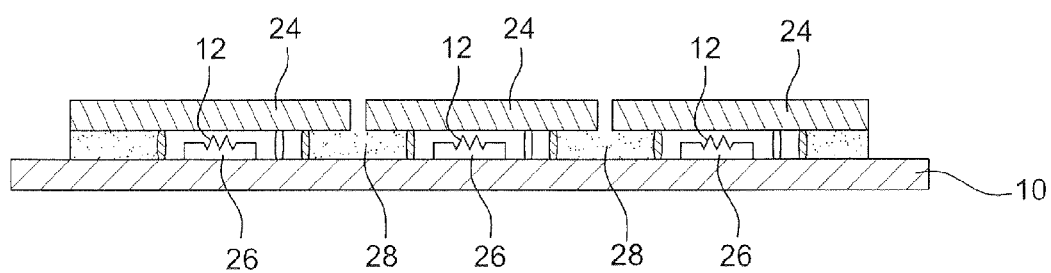

The method then continues with an underfilling step (FIGS. 4 and 5). A filling material 28 in liquid form, advantageously a cross-linkable polymer, for example, an epoxy resin cross-linkable in a cross-linking oven, is injected between substrate 10 and caps 24. Filling material 28 then flows to totally fill the space between components 10, 24 and the solidification of said material 28 is obtained before any penetration thereof into cavities 26. Said cavities are thus coated with filling material 28. Further, material 28 fills first vents 18, thus making cavities 26 fully tight.

As a variation, the filling material is deposited in liquid form on component 10 before caps 24 are installed, after which said caps are installed on walls 14, 16 level with MEMS circuits 12 so that the filling material is sandwiched between component 10 and caps 24 to enable a progress by capillarity.

Figure 6:
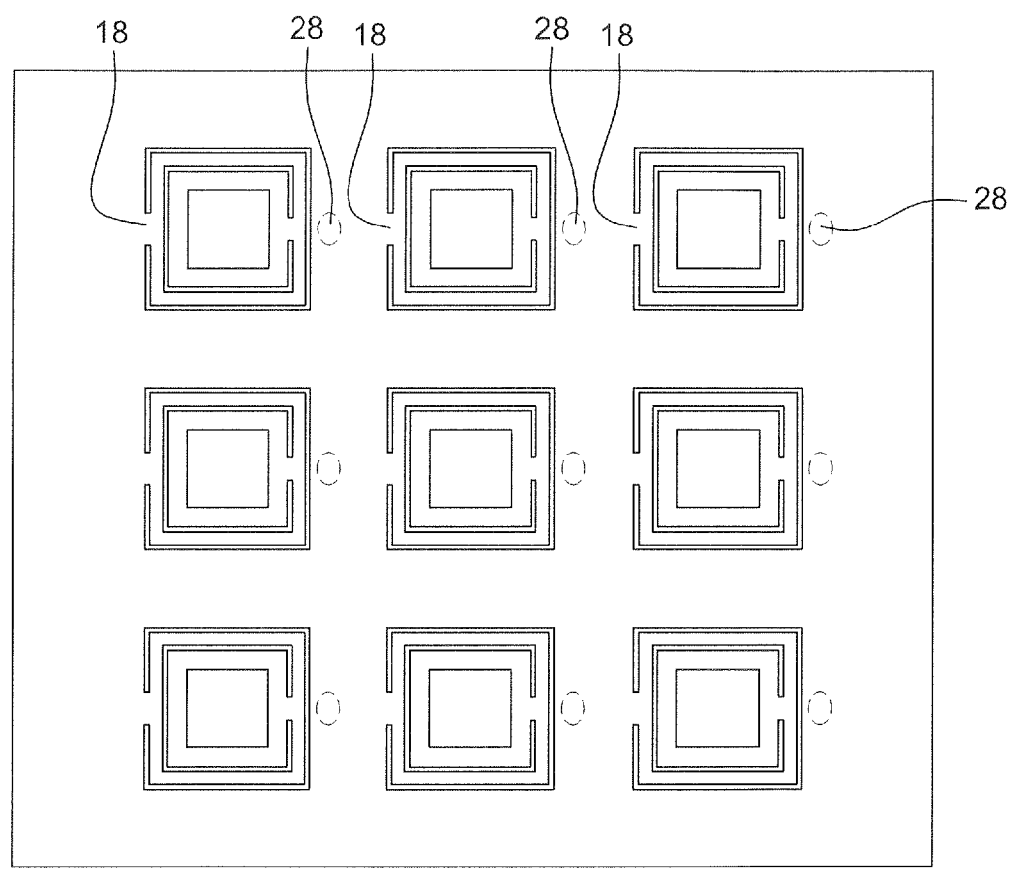
FIG. 6 is a top view, similar to FIG. 4, of another way of implementing the present invention.

In the example of FIG. 6, filling material 28 is injected, before or after the installation of caps 24, between hybridized components 10, 24 in the form of a drop for each cavity 26 opposite to first vent 18 thereof. Filling material 28 then advances between hybridized components 10, 24 by capillarity.

Figure 7:
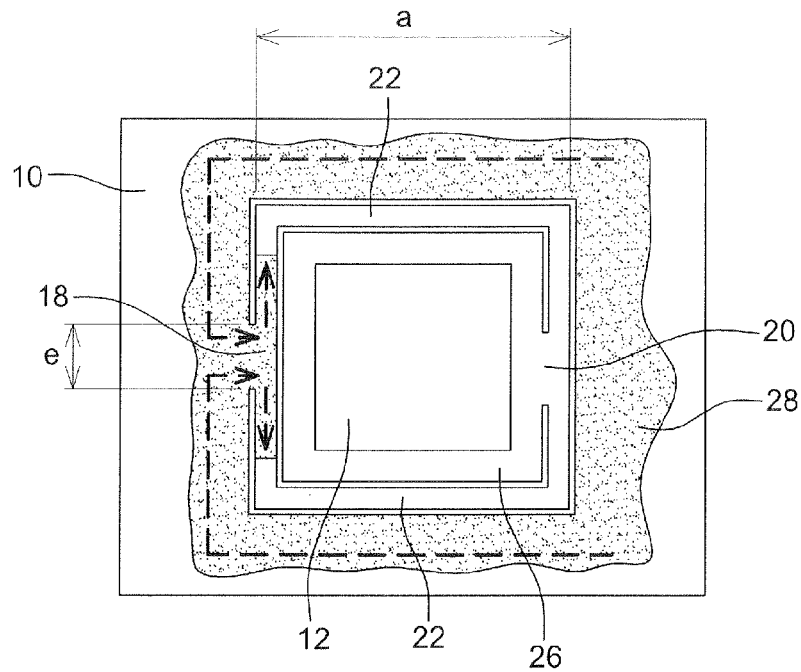
FIGS. 7 and 8 are two embodiments illustrating two injections of filling material for the underfilling operation, according to the present invention.

Referring to FIG. 7, the way of selecting the length of a bypass duct 22 associated with a cavity 26 will now be described.

As described in this drawing, filling material 28 flows by capillarity from its injection location(s) to reach first vent 18 of cavity 26, as illustrated by the arrows. Filling liquid 28 then migrates by capillarity at speed V in bypass duct 22. Speed V is determined by the dimensions of section S of duct 22, by viscosity μ of filling material 28, and by temperature T thereof. It should be noted that this speed can easily be calculated or measured on a test device for the considered duct, material, and temperature. In particular, when these three parameters are constant, flow speed V in duct 22 is constant.

Thus, if L is the length of duct 22 between first vent 18 and second vent 20, the filling is material reaches second vent 20

$$t_{mig} = \frac{L}{V}$$

seconds after having penetrated through first vent 18 if nothing is done to solidify it.

Knowing, for example, time $t_{solid}$ necessary to fully solidify the filling material, the length of the duct is for example selected so that $t_{solid} < t_{mig}$, is $L > t_{solid} \times V$.

It should be noted that it is also possible to set migration time $t_{mig}$ by setting section S of the duct and/or viscosity μ of filling material 28. It is also possible to set the dimensions of duct 22 according to the time necessary to solidify the filling material. Especially, shorter ducts 22 and/or ducts of smaller section may be selected if filling material 28 solidifies faster.

A specific embodiment according to which bypass duct 22 is formed by means of two nested frames has been described.

Of course, other embodiments are possible. Especially, more than two frames may be nested in one another, such as for example illustrated in FIG. 8, where three frames 14, 16, 30 are nested, the vent of a frame being positioned opposite to the vent of the closest external frame. Thus, the more frames there are, the longer the bypass duct and the more time is available between the time when the filling material is deposited and the time when the cap is installed, which is advantageous when more than some hundred circuits are hybridized. Indeed, when a number of circuits has to be hybridized, a time "tpd" elapses between the deposition of glue on the first chip and the deposition of glue on the last chip. It should thus be ensured that the glue remains in the bypass duct, and does not reach the cavity, for the last chip as well as for the first one, the latter "seeing" the glue advance for a longer time (=tpd).

Figures 8, 9:
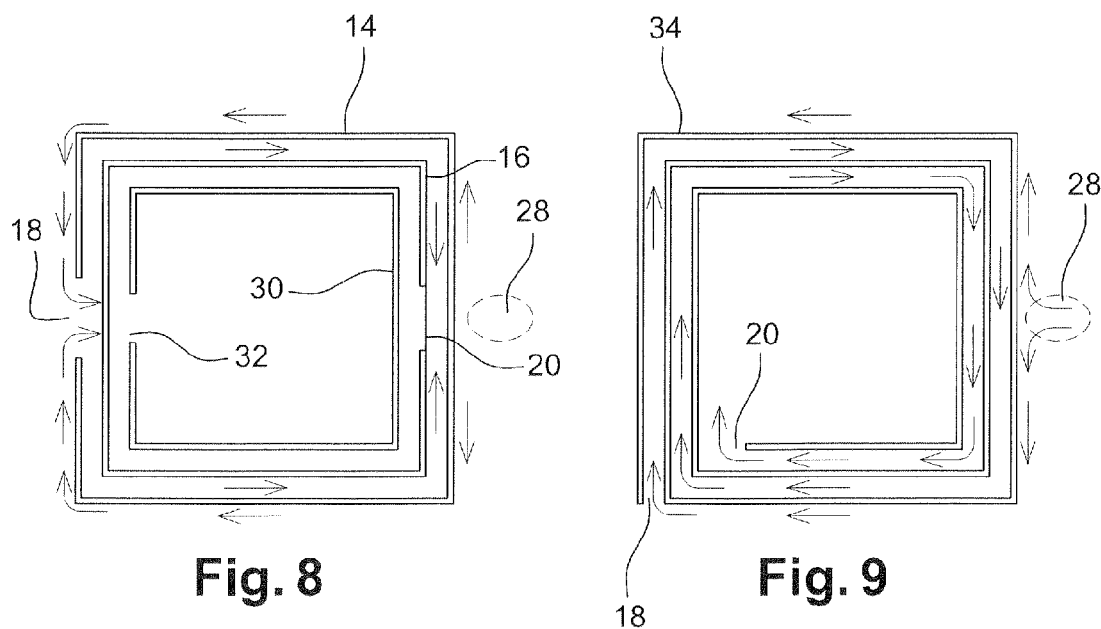
FIG. 9 is a top view of a cavity and of its bypass duct in the presence of the liquid filling material.

Similarly, as illustrated in FIG. 9, a single spiral-wound wall 34 may be used to form the external frame and the bypass duct, which enables to form a long bypass duct on a minimum surface area.

An application of a method according to the present invention to the collective manufacturing of MEMS circuits has been described. Of course, the present invention applies to other types of circuits requiring to be enclosed in tight cavities. For example, the circuits may be IRCMOS-type infrared detection circuits, or more generally any type of tight optics, gas sensors, mini-displays of OLED, LCD or other types, biochips, imagers or emitters of any wavelength, cooled or non-cooled infrared imagers, etc. . . .

As a numerical example, for an epoxy resin having a viscosity equal to 2500 cps at an ambient temperature of 20° C., and for a constant section S of the bypass duct equal to 350 square micrometers, speed V has been measured as being equal to 0.5 millimeter per minute. The time of full solidification of this epoxy resin is approximately 30 minutes in a cross-linking oven at 80° C.

By selecting a duct length L greater than $t_{solid} \times V = 15$ mm, the epoxy resin is solidified in bypass ducts 22 before having reached second vent 20, that is, the tight cavities containing the circuits.

For a substantially square array of circuits of previously-mentioned type having a 7.5-millimeter side length, which for example corresponds to a detection circuit of IRCMOS type equipped with an array of 500 unit detection elements by 500 unit detection elements with a 15-micrometer step, lateral walls having a 7-micrometer height, spaced apart by 50 micrometers, are selected, and a section S of 350 square micrometers is thus defined for bypass ducts 22.

In the embodiment comprising two nested frames, such as for example illustrated in FIG. 7, length L is equal to L=2a−e when external frame 14 and internal frame 16 are square with a side length equal to a with first and second vents having a width equal to e. By selecting squares of a 10-millimeter side length with 2-millimeter vents, the material is stopped in duct 22 before penetrating into cavity 26 since the duct length is equal to 18 millimeters, that is, a distance greater than the maximum 15 millimeters that the epoxy resin can travel with its full solidification.

In the embodiment comprising a lateral wall 34 wound in square spirals to form two loops, with a side length equal to 10 millimeters, the duct length is equal to 40 millimeters, that is, again, a length much greater than the previously-mentioned 15 millimeters.

The installation of several individual caps has been described. Of course, the present invention also applies to the installation of a single cap formed of a single piece.

Further, a single step of deposition of the filling material has been described. As a variation, the filling material is deposited in stages, that is, a first deposition is performed to form the tight cavities, followed by one or several other consecutive depositions for totally filling the space between hybridized components if the first deposition does not totally fill this space.

Further, the quantity of filling material may also be selected to, instead of totally filling the space between hybridized components, only fill a volume around the cavities, which is advantageous if the cavities are subsequently individualized since a minimum quantity of filling material is used.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method for manufacturing a microelectronic assembly comprising at least one first and one second microelectronic components placed one on top of the other and between which is formed at least one tight cavity embedded in a filling material, comprising:
    defining said cavity by means of a lateral wall forming a closed frame extending around a determined area of the first component except for an opening used as a vent;
    forming within the closed frame and opposite to the vent an obstacle capable of forming, in cooperation with the lateral wall, a bypass duct or line for the filling material;
    performing a flip-chip hybridization of the first and second components, a surface of the second component resting on the upper edge or end of the lateral wall formed on the first component to form said at least one cavity;
    injecting the filling material in liquid form between the two hybridized components to embed said at least one cavity and to make it tight by obstruction of the vent as said filling material solidifies;
    the length of the bypass duct being greater than the distance traveled by the filling material between its presentation at the level of the vent and the moment when the filling material solidifies.

2. The method for manufacturing a microelectronic assembly of claim 1, wherein the forming of said at least one cavity results from the forming on the surface of said first component:
    of an external lateral wall forming a closed frame, except for a first vent;
    and of a lateral wall, internal with respect to the frame thus formed, defining a bypass duct between the first vent and said area.

3. The method for manufacturing a microelectronic assembly of claim 2, wherein the external and internal lateral walls associated with each of at least part or all of the cavities form an assembly of at least two frames nested around the cavity and closed except for one vent per frame, the vent of a frame being arranged opposite to the vent of the closest frame containing it.

4. The method for manufacturing a microelectronic assembly of claim 2, wherein the external and internal lateral walls associated with each of at least part or all of the cavities form a spiral-shaped duct opened towards the cavity by a second vent.

5. The method for manufacturing a microelectronic assembly of claim 3, wherein the external and internal lateral walls associated with each of at least part or all of the cavities form a spiral-shaped duct opened towards the cavity by a second vent.

6. The method for manufacturing a microelectronic assembly of claim 1, wherein the filling material in liquid form is a cross-linkable polymer, the solidification being performed by cross-linking of said polymer.

7. The method for manufacturing a microelectronic assembly of claim 1, wherein the first vents are formed substantially at the same location in the external frames of the cavities, and wherein the filling material is injected at a location opposite to said first vents of each of the cavities.

8. The method for manufacturing a microelectronic assembly of claim 1, wherein the length of the bypass ducts is determined according to the flow speed of the filling material in liquid form.

9. The method for manufacturing a microelectronic assembly of claim 1, wherein at least the injection of the filling material is performed under a low pressure, in vacuum, or under a controlled atmosphere.

10. The method for manufacturing a microelectronic assembly of claim 1, wherein said area is intended to receive an electronic, optical, opto-electronic component or a MEMS.

11. A microelectronic assembly comprising first and second microelectronic components installed one on top of the other, and between which are formed tight cavities embedded in a tilling material, said assembly being obtained according to the method of claim 1.

12. The microelectronic assembly of claim 11, wherein the tight cavities comprise microelectronic circuits, and especially sensitive detection elements, MEMS-type circuits, or electric connectors.

13. The assembly of claim 11, wherein the first microelectronic component or the second microelectronic component is a cap.

14. The assembly of claim 12, wherein the first microelectronic component or the second microelectronic component is a cap.

* * * * *